United States Patent [19]
Hochstein

[11] Patent Number: 5,857,767
[45] Date of Patent: Jan. 12, 1999

[54] THERMAL MANAGEMENT SYSTEM FOR L.E.D. ARRAYS

[75] Inventor: Peter A. Hochstein, Troy, Mich.

[73] Assignee: Relume Corporation, Troy, Mich.

[21] Appl. No.: 805,763

[22] Filed: Feb. 25, 1997

Related U.S. Application Data

[63] Continuation-in-part of Ser. No. 710,675, Sep. 23, 1996, abandoned.

[51] Int. Cl.$^6$ ...................................................... F21V 29/00
[52] U.S. Cl. .......................... 362/294; 362/547; 362/373; 362/800
[58] Field of Search ..................................... 362/294, 373, 362/800, 249, 235, 547

[56] References Cited

U.S. PATENT DOCUMENTS

| | | |
|---|---|---|
| 4,729,076 | 3/1988 | Masami et al. . |
| 4,733,335 | 3/1988 | Serizawa et al. . |
| 4,774,434 | 9/1988 | Bennion . |
| 5,038,255 | 8/1991 | Nishihashi et al. . |
| 5,528,474 | 6/1996 | Roney et al. . |

*Primary Examiner*—Thomas M. Sember
*Attorney, Agent, or Firm*—Howard & Howard

[57] ABSTRACT

A method of manufacturing an electrically driven L.E.D. lamp assembly (10) comprising the steps of screen printing an electrically insulating coating (16) which can be of less than two hundred microns thickness over an electrically and thermally conductive heat sink, i.e., aluminum, and printing circuit traces 18 of a resin with metal dispersed therein in end to end relationship on the routes of insulating coating 16 to establish discrete and electrically conductive paths for electrically interconnecting light emitting diodes 20. The light emitting diodes 20 are adhesively secured to the ends of adjacent circuit traces 18 with an electrically conductive adhesive 26 comprising an organic polymeric material compounded with a metal.

25 Claims, 2 Drawing Sheets

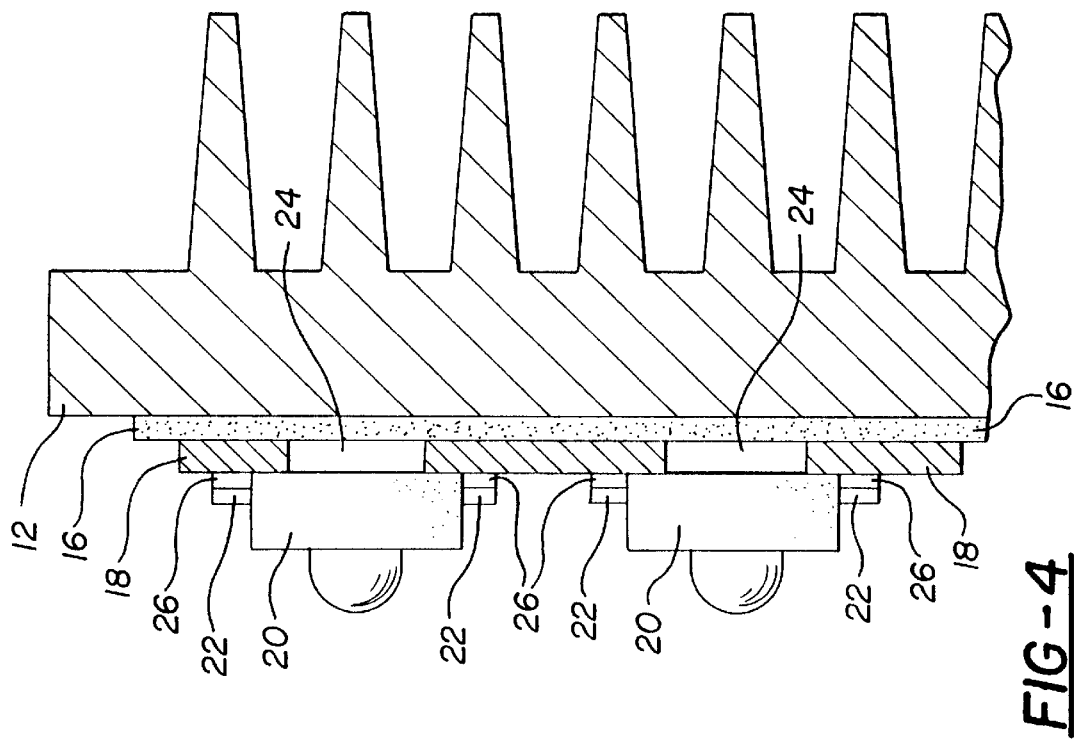
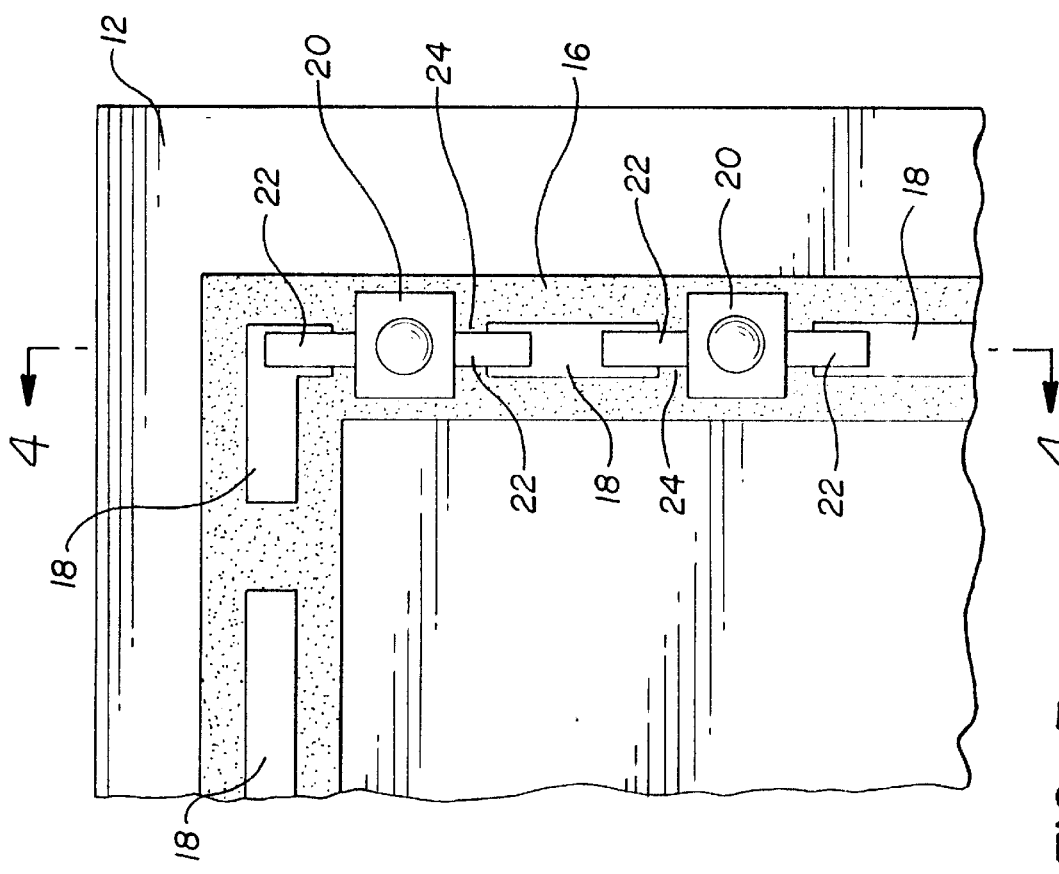

THERMAL MANAGEMENT SYSTEM FOR L.E.D. ARRAYS

RELATED APPLICATION

This application is a continuation-in-part of application Ser. No. 08/710,675 filed 09/23/96, and now abandoned.

TECHNICAL FIELD

The subject invention relates to light emitting diodes mounted in an array on a circuit and, more particularly, to the avoidance of degrading temperatures in the fabrication and use of the light emitting diodes.

BACKGROUND OF THE INVENTION

Light emitting diodes (LEDs) have been available since the early 1960's in various forms, and are now widely applied in a variety of signs and message boards. The relatively high efficacy of LEDs (in lumens per Watt) is the primary reason for their popularity. Tremendous power savings are possible when LED signals are used to replace traditional incandescent signals of similar luminous output. One aspect of LED technology that is not satisfactorily resolved is the application of LEDs in high temperature environments. LED lamps exhibit a substantial light output sensitivity to temperature, and in fact are permanently degraded by excessive temperature. Recent developments in LED technology have extended the maximum recommended operating temperature to 85° C. These devices, which incorporate the element Indium in their chemistries exhibit typical (half brightness) lives on the order of 100,000 hours at 25° C. However, degradation above 90° C. is very rapid as the LEDs degrade exponentially with increases in temperature. The well known Arrhenius function approximately models this behavior, and predicts elevated temperature lifetimes of less than one year at temperatures approaching 100° C. While such high temperatures might seem unusual for an LED operating environment, they are actually quite common. For example, traffic signal housings exposed to full summer sun can reach interior temperatures of 80° C. without any lamp generated heat load. A thermal rise of only 20° C., due to LED operation will stress the LEDs well beyond their sanctioned operating range.

Permanent thermal degradation of LEDs also occurs during array fabrication, when the LEDs are soldered to the supporting and/or interconnecting circuit board. Typical soldering temperatures (250° C.) can significantly degrade the LED array before it is even put into service. LED manufacturers recommend the use of lead lengths of sufficient length to prevent excessive heat transmission from the soldering operation into the LED die. Of course, the added lead length acts detrimentally during LED operation, as the longer leads increase the thermal resistance and adversely affects the rejection of self generated heat. Surface mounted LEDs are even more difficult to solder without damage, as their leads are more closely thermally coupled to the LED die than in other package styles. The obvious dilemma is the need for good thermal coupling from the LED during operation to aid in heat extraction, while there is a need to limit heat transfer to the LED during soldering operations.

The need for thermally conductive substrates in a variety of high power density electronic products has led to the development of a number of unique substrate materials. These products generally perform a mechanical component support function, also provide for electrical interconnection to and between components, and optimally allow for the extraction and dissipation of component generated heat. Some of the more successful approaches include ceramic, non conductive cermet or even coated metallic substrates which are then laminated with copper, and are processed like conventional printed circuit boards. Thermally conductive ceramics are very costly compared to metal, and are reserved for very high temperature applications. The most common insulated metal substrates employ an aluminum or copper base, and a thin (20 micron) polyamide or resinous insulating coating that bonds the nominally 1 mil copper laminate to the substrate material. The effective thermal conductance of the dielectric insulator is relatively high because it is very thin. Of course the electrical insulating quality of the dielectric coating is important as it determines the maximum operating voltage of the circuit board 'sandwich'. Puncture voltage and dielectric dissipation of the insulator coating is obviously a function of film thickness, and integrity. The difficulty in fabricating these composite, laminate, circuit boards, using dielectric films makes these components expensive when compared to conventional circuit boards. For critical, high performance uses this significant added cost is justified, but for uses that demand large substrates, the economics clearly do not favor these exotic composite, thermally conductive, laminate substrate materials. Also, the prior art attaches the LEDs to a free standing film or insulating substrate that is then laminated to the support structure or enclosure. Such lamination is not cost efficient, nor does lamination impart good thermal conductivity because of the inherent difficulty in achieving intimate contact between the thin film and the underlying substrate.

There are commercial products that have combined the use of films or sheets laminated to metallic substrates. One of the materials is "Koolbase" produced by Densitronics Corp., where a thin (1 oz.) copper foil is laminated with a 20 to 40 micron polyimide insulator to an aluminum base, by using heat and pressure. The resulting composite circuit board can be processed conventionally, and has excellent thermal properties; unfortunately, the process is very costly and cannot be applied to large circuit boards. A line of compact LED arrays manufactured by Mitsubishi Cable Col, called "Albaleds" use this composite substrate material. Another source for composite metallic substrates is the Berquist Corporation, which produces a rolled copper foil composite that is laminated to an aluminum substrate with an intervening proprietary insulation layer. This material is also rather costly and is processed like conventional printed circuit board material. That is, the necessary copper traces are formed by etching away the undesired copper by the traditional subtractive processes. The hybrid "chip on board", Mitsubishi LED array, is fabricated by traditional wire bonding techniques that are common to the semiconductor industry. The precision and tolerances required for hybrid fabrication limit the size of such LED arrays to about 100 $cm^2$. Larger assemblies would have to be built up from a series of smaller hybrid arrays, further increasing manufacturing cost.

Various patents address the problem of heat dissipation in LED lamps but, in one way or another, each combination inherently includes an element with a high thermal resistance that impedes the dissipation of heat from the LEDs. The U.S. Pat. No. 4,729,076 to Masami et al discloses an LED lamp assembly wherein a heat absorber, in the form of an electrically insulating sheet, is disposed between the circuit board holding the LEDs and the heat sink. Clearly, much thermal efficiency is lost in the use of such a high thermal resistance heat absorber. The U.S. Pat. No. 4,774, 434 to Bennion discloses an LED disposed on a cloth shirt.

A conductive epoxy material attaches the LED to a copper trace on a film substrate which is, in turn, adhesively secured to the cloth shirt. Obviously, the impediment to heat dissipation is the shirt since the shirt is not thermally conductive, i.e., cannot act as a heat sink. Accordingly, the use of a thermally conductive adhesive serves no thermally useful purpose and is unimportant and incidental. The U.S. Pat. No. 5,038,255 to Nishihashi et al discloses the laminating of a polyamid film substrate along with circuit patterns during the molding of an aluminum oxide filled resin support housing; alternatively, the circuit patterns are printed on the film. However, the use of a resinous material as the heat sink implies a thermal conductivity one hundred times lower than a metal substrate and therefore acts as an impediment bottleneck to the most efficient dissipation of heat. The conventional attachment of LED leads by soldering, as disclosed in U.S. Pat. No. 5,528,474 to Roney et al, is difficult to do without damaging the LEDs due to the high heat generated during the soldering operation and, even then, the long leads of the LEDs impede heat transfer during operation.

SUMMARY OF THE INVENTION AND ADVANTAGES

A method of manufacturing an electrically driven L.E.D. lamp assembly comprising the steps of disposing an electrically insulating coating of less than one thousand microns thickness over an electrically and thermally conductive and entirely metal beat sink, printing circuit traces on the coating to establish discrete and electrically conductive paths for electrically interconnecting light emitting diodes, and adhesively securing light emitting diodes to the circuit traces with an electrically and thermally conductive adhesive.

An electrically driven L.E.D. lamp assembly comprising an electrically and thermally conductive and entirely metal heat sink with an electrically insulating coating over the electrically and thermally conductive insulating heat sink, the coating being less than one thousand microns in thickness and disposed only along predetermined routes having edges to define open areas between the edges of the routes. Circuit traces are disposed in predetermined spaced lengths along the routes and between the edges of the routes defined by the coating to prevent electrical conduction between the traces and from the traces to the heat sink. A plurality of light emitting diodes having electrical leads are secured to adjacent ones of said circuit traces by an electrically and thermally conductive adhesive.

Accordingly, the present invention addresses the paradoxical issues of the need for good thermal coupling from the LED to an effective heat sink during operation to aid in heat extraction, while not subjecting the LED to processing temperatures that might damage the devices during manufacture. The subject invention provides a novel combination, which not only thermally protects the LED during array manufacture, but enhances heat extraction during operation by significantly reducing thermal impedance or bottlenecks to heat conduction from the LEDs to an effective heat sink.

BRIEF DESCRIPTION OF THE DRAWINGS

Other advantages of the present invention will be readily appreciated as the same becomes better understood by reference to the following detailed description when considered in connection with the accompanying drawings wherein:

FIG. 3 is an enlarged plan view of light emitting diodes mounted on a metal heat sink in accordance with the subject invention; and FIG. 4 is a cross sectional view taken substantially along line 4—4 of FIG. 3.

DETAILED DESCRIPTION OF THE PREFERRED EMBODIMENT

Figure 1:
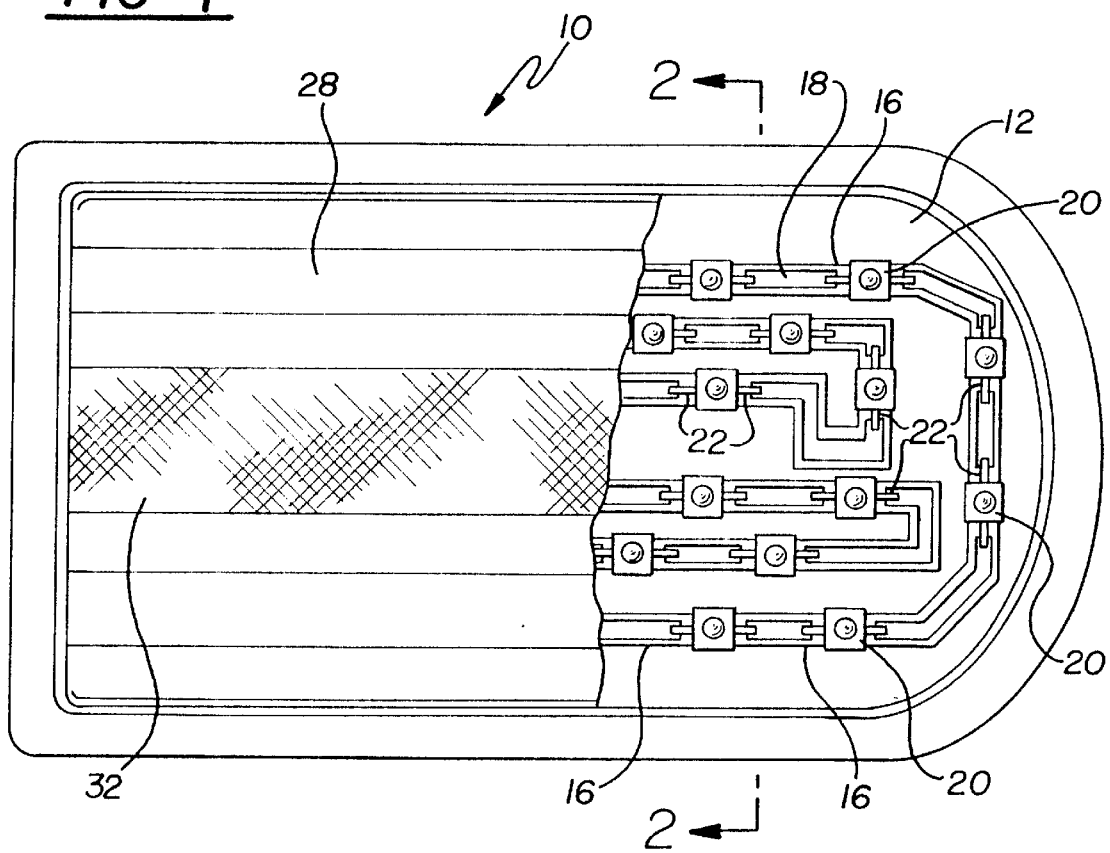
FIG. 1 is a plan view partially broken away of an light emitting diode lamp assembly constructed in accordance with the subject invention.
Figure 2:
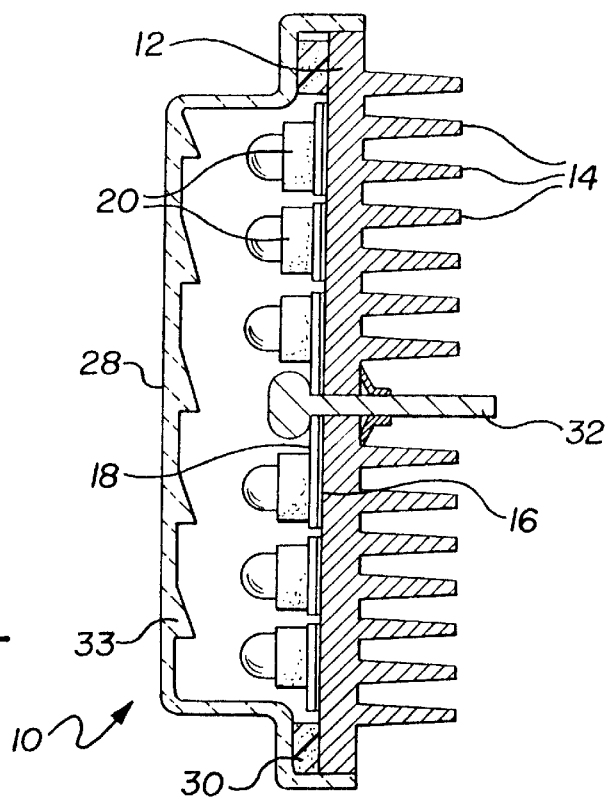
FIG. 2 is a cross sectional view taken substantially along line 2—2 of FIG. 1.

Referring to the Figures, wherein like numerals indicate like or corresponding parts throughout the several views, an electrically driven L.E.D. lamp assembly is generally shown at 10. The lamp assembly 10 comprises an electrically and thermally conductive heat sink 12. In the preferred embodiment the heat sink 12 is made entirely (i.e., one hundred percent) of metal, preferably a homogenous aluminum or aluminum alloy which is also formed to include heat radiating fins 14 which dissipate heat.

An electrically insulating dielectric coating 16 is disposed over the electrically and thermally conductive insulating heat sink 12. The coating 16 is less than one thousand microns in thickness and may be disposed along predetermined routes having edges to define open areas between the edges of the routes, or coating 16 may cover and insulate the entire surface of heat sink 12. In other words, the coating 16 may be disposed in circuitous tracks separated from one another by the bare metal of the heat sink 12, or coating 16 may be continuous. Preferably the coating 16 is about one hundred microns but no more than three hundred microns thick.

Circuit traces 18 are disposed in predetermined spaced lengths along the routes 16 and between the edges of the routes defined by the coating to prevent electrical conduction between the traces 18 and from the traces 18 to the heat sink 12. The lateral edges of the conductive traces 18 are spaced inwardly from the lateral edges of the routes 16 to prevent electrical conduction from the traces 18 to the aluminum substrate or heat sink 12.

The assembly includes a plurality of light emitting diodes (L.E.D. s) 20 each having electrical leads 22. The L.E.D. s 20 span the voids or spaces 24 between the ends of adjacent traces 18. An electrically conductive adhesive 26 secures the oppositely ending leads 22 of the light emitting diodes 20 to adjacent ones of the circuit traces 18.

Accordingly, the electrically driven L.E.D. lamp assembly 10 is manufactured by disposing the electrically insulating coating 16 of less than one thousand microns thickness over the electrically and thermally conductive heat sink 12, preferably in discrete routes or circuits, although the method of manufacture is novel in applying the coating 16 over the entire surface of the heat sink 12. The electrically insulating coating 16 is formed with a thickness of ten microns to one thousand microns, preferably one hundred microns. The electrically insulating coating 16 may be formed on an aluminum heat sink 12 by anodizing the aluminum to form an aluminum oxide film. However, the preferable method is to apply the coating 16 with a thixotropic material, i.e., a very high viscosity material, by screen printing. The paste-like material is cured into a smooth, hard and homogenous coating 16. Alternatively, the coating 16 may be applied by dipping the heat sink into liquid material or sprayed on and thereafter curing to define the coating 16.

The next step is the printing of the circuit traces 18 on the routes of the coating 16 to establish discrete and electrically conductive paths for electrically interconnecting the light emitting diodes 20. The circuit traces 18 are printed on the electrically insulating coating 16 by screen printing. The circuit traces 18 may consist of a polymeric material having metal particles dispersed therein, such as an epoxy compounded with a noble metal, i.e., silver or gold or an alloy thereof.

Alternatively, a phenolic resin compounded with either copper, silver or nickel may be used.

As alluded to above, the electrically insulating coating 16 may be printed only along predetermined routes to leave open areas therebetween, to conserve material, and the conductive traces 18 are printed in predetermined spaced lengths within and spaced from the edges of the routes to prevent electrical conduction between or among traces 18 and from the traces 18 to the heat sink 12.

The leads 22 of the light emitting diodes 20 are adhesively secured to the circuit traces 18 with an electrically and thermally conductive adhesive 26 by depositing small patches of the electrically and thermally conductive adhesive 26 at spaced positions on the ends of the circuit traces 18. A mechanized applicator may individually apply the patches of adhesive or the patches 26 may also be applied with a stencil. The leads 22 of the light emitting diodes 20 may be placed into registry with the patches of adhesive 26 by a robot pick and place machine that attaches the LEDs, properly positioned for alignment with the predetermined positions, to the substrate.

The adhesive 26 is cured while subjecting the leads 22 of the light emitting diodes 20 to a temperature of less than 100° C. In other words, the leads 22 are not subjected to the high soldering temperatures which would degrade the LEDs. In actual fact, the adhesive 26 may be cured at temperatures as low as 60° C., and even at room temperatures with extended cure times.

Therefore, an LED signal array consisting of several parallel strings of series interconnected LEDs is expeditiously fabricated by using packaged, leaded LEDs that are adhesively attached to an aluminum or thermally conductive substrate. An aluminum (or other thermally conductive metal) substrate is first coated with a insulating, dielectric coating 16. This coating 16 would be typically less than three hundred microns in thickness and could be applied by conventional screen printing methods with a thixotropic material. Commercially available dielectric inks or resins containing epoxies or other polymers provide void and pinhole free conformal coatings. Continuous, homogenous and high integrity coatings without defects are essential to realizing adequate puncture voltage when used as a base for subsequent conductor coatings.

Optimally, a loaded, thermally conductive epoxy resin such as that sold under the trademark Thermoset Plastics Corp. 340 material could be utilized to enhance the heat transfer from subsequent coatings to the metallic substrate. For low voltage applications, the dielectric insulating coating 16 could be formed chemically on the surface of the substrate 12. For example, if aluminum or aluminum alloys were used for the substrate material 12, a 50 micron thick, dense and adherent aluminum oxide coating could be electrochemically formed on the substrate. Such anodized coatings are extremely adherent and offer excellent thermal conductance and acceptable puncture voltage.

Conductive epoxies, compounded with silver, silver alloys, or gold are commonly used in the electronics industry for semiconductor die attachment. These adhesives exhibit good thermal conductivity, excellent adhesion and electrical conductivity. For non critical applications phenolic resins with non nobel metal loading (such as copper or nickel) could be used to advantage. In other words, the adhesive is an organic polymeric material compounded with a metal to provide excellent thermal and electrical conductivity.

The "additive" nature of the screen printing process puts down conductive traces 18 only in specific routes or locations as required by the circuit. This feature is distinctly different than the circuit traces that are etched on existing insulated metallic substrates. In the latter, a continuous copper layer or cladding is preferentially removed by traditional photo-etching processes.

Most conductive polymers suitable for screen printing cure to an optimal thickness of 1–3 mils, and are very adherent to the dielectric coating and underlying metal substrate. A history of successful semiconductor die attachments to metal substrates is due in part to the excellent mechanical and thermal properties of modem conductive adhesives and polymers. These materials not only minimize the thermal gradient across the bond junction but allow for some degree of thermal expansion mismatch by compliantly deforming. The modulus of most conductive adhesives or resins is orders of magnitude lower than the metallic elements that they are coupled to, so that small dimensional changes due to thermally induced expansion can be accommodated.

Typically, the cured conductive traces 18 would be overprinted with a different screen that would deposit small patches 26 of conductive adhesive in the lead 22 attachment areas of the LEDs. Common, surface mount LEDs 20 with either flat or formed leads 22 would then be placed in their respective positions on the printed array, in register with the screen printed conductive adhesive patches 26. The completed array would then be cured to set (harden) the conductive adhesive 26 and hold the LEDs in place. Naturally, U.V. catalyzed adhesives could also be used to fix the LEDs in position before the conductive adhesive hardened. Instead of a "pick and place" assembly method, an assembly fixture, gang loaded with the suitable LED complement could be used to hold the LEDs in register with the conductor traces 18 while the conductive adhesive 26 cured.

Other LED package geometries could be accommodated by the proposed assembly technique, by properly forming the leads 22 of such devices to make them adaptable to adhesive attachment. Such leads could be very short (to enhance thermal coupling) with no concern for overheating during array assembly as the process involves no soldering.

The LED arrays fabricated by the method of the present invention require no critical lens alignment or the addition of a separate transparent lens array as do the hybrid devices of the prior art. Using packaged, leaded LEDs with integral lenses permits very large arrays to be manufactured with relatively low cost equipment. Furthermore, the ability to individually test LEDs prior to attachment and the ability to repair defective LEDs after assembly is an important feature of the present invention.

An advantage of using the conductive metal substrate 12 as the mechanical support for the LED array is the ability to reject heat directly to ambient from the operating LEDs. The back cover or rear surface of the LED array is actually the supporting substrate, which can be cooled convectively by circulating air. The addition of fins 14 or other surface area enhancements to this rear surface could further improve heat rejection from the LEDs.

For many applications, the electrical circuitry and LEDs would have to be protected from dust, dirt, weather, U.V., etc. A simple, transparent cover 28 of glass or plastic could be attached to the metallic substrate 12 by any number of means that would occlude contaminants. Elastomeric seals, adhesives or even glass to metal seals, as indicated at 30, could be used to provide near hermeticity. Of course, provisions for master electrical leads 32 would have to be provided, and these could pass through seals in the back cover or substrate 12 of the LED array.

A typical application of the technology of the present invention is shown in FIG. 1 in the form of an automotive tail light including a reflector 32 in the cover 28. This LED automotive lamp assembly offers tremendous size, weight, cost, power and reliability advantages over conventional incandescent practice. Naturally, this same topography may be applied to traffic signals of all types, message boards or any large area LED array. Not only is this approach extremely cost effective, but heat transfer from the operating LEDs is enhanced, so that temperature rise is minimized,. thereby improving light output and reliability. The addition of prismatic refractor 33 (which may be a separate element or simply be molded into the front cover 28 as shown) allows much of the wasted LED energy to be directed to the horizon where it is needed. Ballasting resistors or other circuit elements can, of course, share the substrate with the LEDs to provide more effective space utilization of the available area. While only single layer circuits have been discussed or shown, the apparatus and methods of the present invention are applicable to multi layer designs as well. Well established means of dielectric isolation, used in hybrid, thick film manufacture can easily be utilized to form multiple (isolated) conductor layer. Such multi coating topographies would be necessary in more complicated circuits with a large number of device interconnections. Thermal conductance of subsequent coatings is somewhat reduced because of the increased thermal resistance of a series of multiple coatings.

However, thermally dissipative components could always be attached to the lowest thermal resistance coating, that is the conductor closest to insulated substrate.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. A method of manufacturing an electrically driven L.E.D. lamp assembly (10) comprising the steps of;
   disposing an electrically insulating coating (16) of less than one thousand microns thickness over an electrically and thermally conductive and entirely metal heat sink (12),
   printing circuit traces (18) on the coating (16) to establish discrete and electrically conductive paths for electrically interconnecting light emitting diodes (20), and
   adhesively securing light emitting diodes (20) to the circuit traces (18) with an electrically and thermally conductive adhesive (26).

2. A method as set forth in claim 1 further defined as forming the electrically insulating coating (16) with a thickness of less than two hundred microns.

3. A method as set forth in claim 1 further defined as forming the electrically insulating coating (16) on an aluminum heat sink (12).

4. A method as set forth in claim 1 further defined as forming the electrically insulating coating (16) on the heat sink (12) by screen printing.

5. A method as set forth in claim 1 further defined as forming the electrically insulating coating (16) on the heat sink (12) by using a thixotropic material and curing the material into a smooth homogeneous coating.

6. A method as set forth in claim 1 further defined as forming the electrically insulating coating (16) on the heat sink (12) by dipping the heat sink into a liquid material and curing the material into the coating (16).

7. A method as set forth in claim 1 further defined as forming the electrically insulating coating (16) on an aluminum heat sink (12) by anodizing the aluminum to form an aluminum oxide coating.

8. A method as set forth in claim 1 further defined as printing circuit traces (18) on the electrically insulating coating (16) by screen printing.

9. A method as set forth in claim 1 further defined as further defined as printing circuit traces (18) with a polymeric material having metal particles dispersed therein.

10. A method as set forth in claim 1 further defined as printing circuit traces (18) with an epoxy compounded with a noble metal.

11. A method as set forth in claim 1 further defined as printing circuit traces (18) with an epoxy compounded with one of silver and gold.

12. A method as set forth in claim 1 further defined as printing circuit traces (18) with a phenolic resin compounded with one of copper and nickel.

13. A method as set forth in claim 1 further defined as adhesively securing light emitting diodes (20) to the circuit traces (18) by depositing small patches of the electrically conductive adhesive (26) at spaced positions on the circuit traces (18).

14. A method as set forth in claim 13 further defined as simultaneously depositing the leads of an array of light emitting diodes (20) into registry with the patches.

15. A method as set forth in claim 13 further defined as stenciling the patches of adhesive (26) onto the circuit traces (18).

16. A method as set forth in claim 1 further defined as adhesively securing light emitting diodes (20) to the circuit traces (18) by depositing an electrically conductive adhesive (26) comprising an organic polymeric material compounded with a metal.

17. A method as set forth in claim 1 further defined as forming heat radiating fins on the heat sink (12).

18. A method as set forth in claim 1 further defined as disposing the electrically insulating coating (16) only along predetermined routes to leave open areas therebetween, and printing the conductive traces (18) in predetermined spaced lengths within and spaced from the edges of the routes to prevent electrical conduction between traces (18) and from the traces (18) to the heat sink (12).

19. A method as set forth in claim 1 further defined as curing the adhesive (26) while subjecting the leads of the light emitting diodes (20) to a temperature of less than 100° C.

20. A method of manufacturing an electrically driven L.E.D. lamp assembly (10) comprising the steps of;
   screen printing an electrically insulating coating (16) of less than three hundred microns thickness over an electrically and thermally conductive and a homogenous aluminum heat sink (12),
   printing circuit traces (18) with a phenolic resin compounded with one of copper, silver and nickel on the coating (16) to establish discrete and electrically conductive paths for electrically interconnecting light emitting diodes (20), and adhesively securing light emitting diodes (20) to the circuit traces (18) with an electrically and thermally conductive adhesive (26) comprising an organic polymeric material compounded with a metal.

21. An electrically driven L.E.D. lamp assembly comprising:

an electrically and thermally conductive and entirely metal heat sink (12);

an electrically insulating coating (16) over said electrically and thermally conductive heat sink (12), and being less than one thousand microns in thickness; circuit traces (18) disposed in predetermined spaced lengths along said coating (16) to prevent electrical conduction between said traces (18) and from said traces (18) to said heat sink (12);

a plurality of light emitting diodes (20) having electrical leads; and an electrically conductive adhesive (26) securing said leads of said light emitting diodes (20) to adjacent ones of said circuit traces (18).

22. An assembly as set forth in claim 21 wherein said heat sink is made of homogeneous aluminum.

23. An assembly as set forth in claim 21 wherein said adhesive comprises an organic polymeric material compounded with a metal.

24. An assembly as set forth in claim 21 including heat radiating fins on said heat sink (12).

25. An assembly as set forth in claim 21 wherein said coating (16) is disposed only along predetermined routes having edges to define open areas between said edges of said routes; and said traces disposed between said edges of said routes.

* * * * *